(12) United States Patent
Hattori (10) Patent No.: US 10,937,492 B2
(45) Date of Patent: Mar. 2, 2021

(54) SEMICONDUCTOR STORAGE APPARATUS

(71) Applicant: Winbond Electronics Corp., Taichung (TW)

(72) Inventor: Norio Hattori, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/742,862

(22) Filed: Jan. 14, 2020

(65) Prior Publication Data

US 2020/0294588 A1    Sep. 17, 2020

(30) Foreign Application Priority Data

Mar. 11, 2019  (JP) .............................. JP2019-044155

(51) Int. Cl.
*G11C 11/00* (2006.01)
*G11C 13/00* (2006.01)
*G06F 12/02* (2006.01)

(52) U.S. Cl.
CPC ...... *G11C 13/0023* (2013.01); *G06F 12/0246* (2013.01); *G11C 13/004* (2013.01); *G11C 13/0069* (2013.01)

(58) Field of Classification Search
CPC ..... G11C 16/0483; G11C 16/26; G11C 16/16; G11C 13/0004; G11C 13/0069; G11C 16/10; G11C 8/08; G11C 8/12; G11C 11/5628; G11C 11/5642; G11C 13/0033; G11C 13/004; G11C 16/08; G11C 16/30; G11C 16/04; G11C 16/34; G11C 16/06; G11C 11/56; G11C 16/14; G11C 29/52; G11C 7/00; G11C 16/24; G11C 8/00; G11C 16/12; G11C 16/32; G11C 11/00; G11C 11/34

(Continued)

(56) References Cited

U.S. PATENT DOCUMENTS 10,503,653 B2 * 12/2019 Hsu ....................... G06F 3/0659
2007/0214309 A1    9/2007 Matsuura et al.
(Continued)

FOREIGN PATENT DOCUMENTS

CN    103559146    2/2014
JP    H0728690     1/1995
(Continued)

OTHER PUBLICATIONS

"Office Action of Taiwan Counterpart Application", dated Oct. 19, 2020, p. 1-p. 5.

(Continued)

*Primary Examiner* — Thong Q Le
(74) *Attorney, Agent, or Firm* — JCIPRNET (57) ABSTRACT

A semiconductor storage apparatus of high convenience, which improves utilization efficiency of a memory region, is provided. A flash memory provided in the disclosure includes a memory controller and an NAND memory device. The memory controller includes an SRAM, an RRAM, and a write/selector. The SRAM stores a conversion table that converts a logical address into a physical address. The RRAM temporarily stores a small amount of data which should be programmed. The write/selector selectively writes the to-be-programmed data into the RRAM or an NAND memory unit of the NAND memory device.

19 Claims, 7 Drawing Sheets

(58) Field of Classification Search
USPC .... 365/185.29, 189.05, 185.22, 189.04, 145, 365/185.03, 185.26, 185.3, 230.08, 233.1, 365/185.08
See application file for complete search history.

(56) References Cited

U.S. PATENT DOCUMENTS

2009/0210611 A1    8/2009   Mizushima
2010/0223420 A1    9/2010   Ahn et al.
2017/0075811 A1    3/2017   Hsu et al.

FOREIGN PATENT DOCUMENTS

| | | |
|---|---|---|
| JP | 2007241576 | 9/2007 |
| JP | 2009175877 | 8/2009 |
| JP | 2009199199 | 9/2009 |
| TW | 201830244 | 8/2018 |

OTHER PUBLICATIONS

"Office Action of Japan Counterpart Application", dated Jun. 24, 2020, p. 1-p. 4.

\* cited by examiner

|    | Data | LBA | LPA | LCA | PBA | Amount of data | Flag |
| --- | --- | --- | --- | --- | --- | --- | --- |
| #0 | | | | | | | |
| #1 | | | | | | | |
| ⋮ | | | | | | | |
| #n | | | | | | | |

SEMICONDUCTOR STORAGE APPARATUS

CROSS-REFERENCE TO RELATED APPLICATION

This application claims the priority benefit of Japan patent application serial no. 2019-044155, filed on Mar. 11, 2019. The entirety of the above-mentioned patent application is hereby incorporated by reference herein and made a part of this specification.

BACKGROUND

Technical Field

The disclosure relates to a semiconductor storage apparatus, and more particularly, to a programming operation of an NAND flash memory.

Description of Related Art

Generally, an NAND flash memory is constituted by including a memory chip and a memory controller for controlling the memory chip in a package. The memory controller is responsible for fixed load, such as error correction of the memory chip or bad block management, thereby reducing the load on a host computer.

Figure 1:
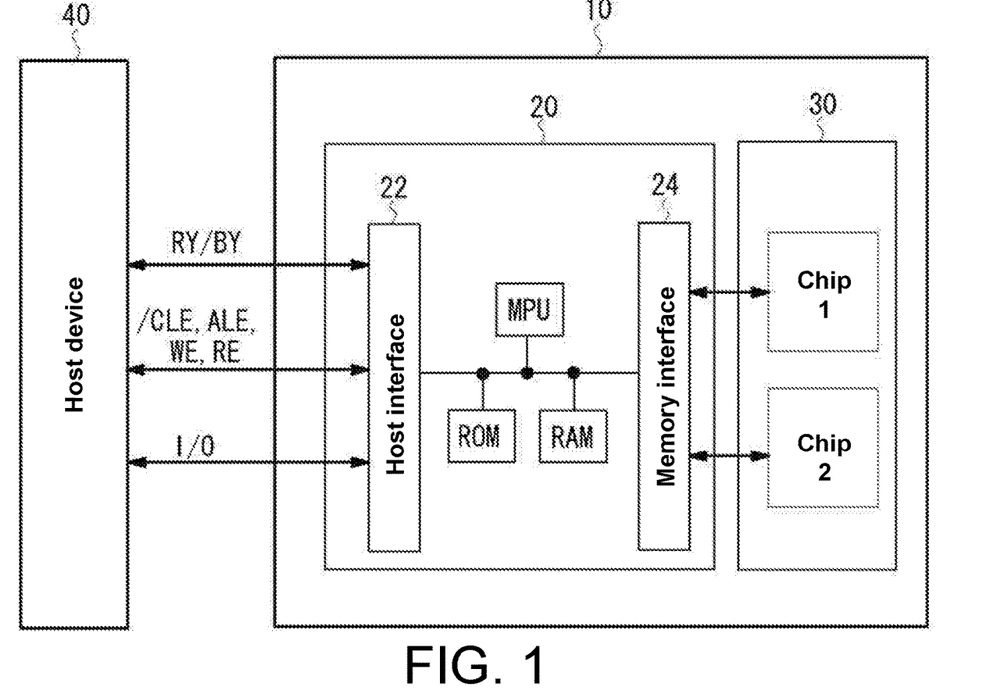
FIG. 1 is a diagram showing an example of a conventional semiconductor memory.

For instance, as shown in FIG. 1, a flash memory system provided in Japanese Laid-Open Patent Application No. 2009-175877 includes a flash memory 10 and a host device 40, and the flash memory 10 includes a memory controller 20 and a memory chip 30. The memory controller 20 includes: a host interface 22 for transmitting data to and from the host device 40, a memory interface 24 for transmitting data to and from the memory chip 30, a microprocessing unit (MPU) that controls the data transmission or the operation of the memory chip, a read only memory (ROM) that stores programs or data, a random access memory (RAM), etc. The memory chip 30 is, for instance, an NAND flash memory chip. The memory controller 20 receives various control signals from the host device 40, e.g., a command latch enabling signal CLE, an address latch enabling signal ALE, data, commands, an input/output signal I/O, etc. Based on these signals, a reading operation RE of the memory chip 30, a writing operation WE thereof, and an erasing operation thereof are controlled. In addition, the memory controller 20 outputs a ready signal RY or a busy signal BY indicating an operation state of the memory device to the host device 40.

In the NAND flash memory, the reading operation and the programming operation are performed in unit of pages, and the erasing operation is performed in unit of blocks. When the host device instructs to perform these operations, it outputs a logical address used for the reading operation, the programming operation, and the erasing operation to the memory controller. The memory controller refers to a conversion table stored in a static random access memory (SRAM), converts the received logical address into a physical address, and performs the programming operation in a memory cell array. When power is turned on, the conversion table is loaded into the SRAM from a prepared area in the memory unit array.

When the host device instructs to perform the programming operation, in addition to various control signals (the command latch enabling signal CLE, the address latch enabling signal ALE, and so on), a programming command, to-be-programmed data, and the logical address LAD are output to the memory controller. The logical address LAD includes: a logical block address LBA, a logical page address LPA, and a logical column address LCA. The memory controller refers to the conversion table, converts the logical block address LBA into a physical block address PBA, and programs the data in the pages of the block specified by the physical block address PBA. The pages in the block are specified by the logical page address LPA.

When the amount of to-be-programmed data is less than one page, useless areas that are not used for performing the programming operation are generated in the page. Besides, the NAND flash memory has a partial page programming function, i.e., a function of performing a plurality of programming operations on data with the data amount less than one page (e.g., 2K bytes) in the same page. However, in the partial page programming function, in order to prevent the adverse effect of repeatedly applying a high programming voltage to the same word line, the maximum number of times of programming operations NOP allowed in the same page is stipulated. Therefore, at a time point when the number of times of programming operations NOP reaches the maximum value, if there is any unused area in the page, useless redundant capacity areas are generated.

In addition, with the increase in the integration of the memory unit array, the amount of data in one page tends to increase. As a result, the amount of data programmed in unit of pages is also increased. As a user, the data in unit of bytes, words, or the like, whose data amount is less than the amount of data in one page, are sometimes expected to be programmed. However, given the NOP restrictions, it is virtually unlikely to program the data with a small amount.

SUMMARY

The disclosure provides a semiconductor storage apparatus which improves the utilization efficiency of a memory area and can easily program data with a small data amount.

In an embodiment of the disclosure, a semiconductor storage apparatus includes: an NAND memory unit array including a plurality of blocks, a non-volatile memory capable of reading and writing data, and a programming element. When a programming command, address information, and to-be-programmed data are input from the outside, if an amount of the to-be-programmed data is less than a baseline amount of data, the to-be-programmed data and the address information are written into the non-volatile memory; if the amount of the to-be-programmed data is equal to or more than the baseline amount of data, the to-be-programmed data are programmed in the memory unit array.

According to an embodiment of the disclosure, when the amount of the to-be-programmed data accumulated in a same page of the non-volatile memory is equal to or more than the baseline amount of data, the programming element programs the accumulated to-be-programmed data in a selected page of the memory unit array. According to an embodiment of the disclosure, the semiconductor storage apparatus further includes a reading element. When the reading element inputs a reading command and the address information from the outside, if the address information in the non-volatile memory is consistent with the address information input from the outside, the data are read from the non-volatile memory, and if the address information in the non-volatile memory is inconsistent with the address information input from the outside, the data are read from the memory unit array. According to an embodiment of the disclosure, the semiconductor storage apparatus further includes a memory storing a conversion table that converts a logical address into a physical address, the programming element refers to the conversion table to convert the logical address input from the outside into the physical address, and the logical address and the physical address are written into the non-volatile memory as the address information. According to an embodiment of the disclosure, after the programming element in the memory unit array programs the to-be-programmed data accumulated in the non-volatile memory, corresponding data of the non-volatile memory become invalid. According to an embodiment of the disclosure, the programming element is capable of programming on the surface of a byte unit or a word unit in the memory unit array. According to an embodiment of the disclosure, the non-volatile memory is a resistive RAM (RRAM).

According to one or more embodiments of the disclosure, when the amount of the to-be-programmed data is less than the baseline amount of data, the to-be-programmed data and the address information are written into the non-volatile memory, and when the amount of the to-be-programmed data is equal to or more than the baseline amount of data, the corresponding to-be-programmed data in the memory unit array are programmed. Therefore, it is likely to program the data with the data amount less than one page of the memory unit array, and the unused and useless redundant capacity of the selected page may be reduced. In addition, the data with the small data amount of data may be repeatedly programmed without being limited by the maximum number of times of programming operations NOP allowed in the same page. As such, the NAND flash memory may bring more convenience.

Furthermore, when the data accumulated in the non-volatile memory has reached the baseline amount of data, the data accumulated in the non-volatile memory are rewritten in the memory unit array, so as to reduce the number of times of programming operations in the memory unit array, thereby enhancing the endurance or data retention capabilities of the NAND flash memory.

In order to make the aforementioned advantages of the disclosure comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Embodiments of the disclosure will be described in detail with reference to the drawings. In one or more embodiments of the disclosure, a flash memory includes a memory device having a memory unit with an NAND string and a memory controller which controls the memory device. The memory controller may be formed on a wafer where the memory device is formed or may be formed on a different wafer. In addition, when the flash memory includes a plurality of wafers, the flash memory may also be constituted by laminating the wafers.

Figure 2:
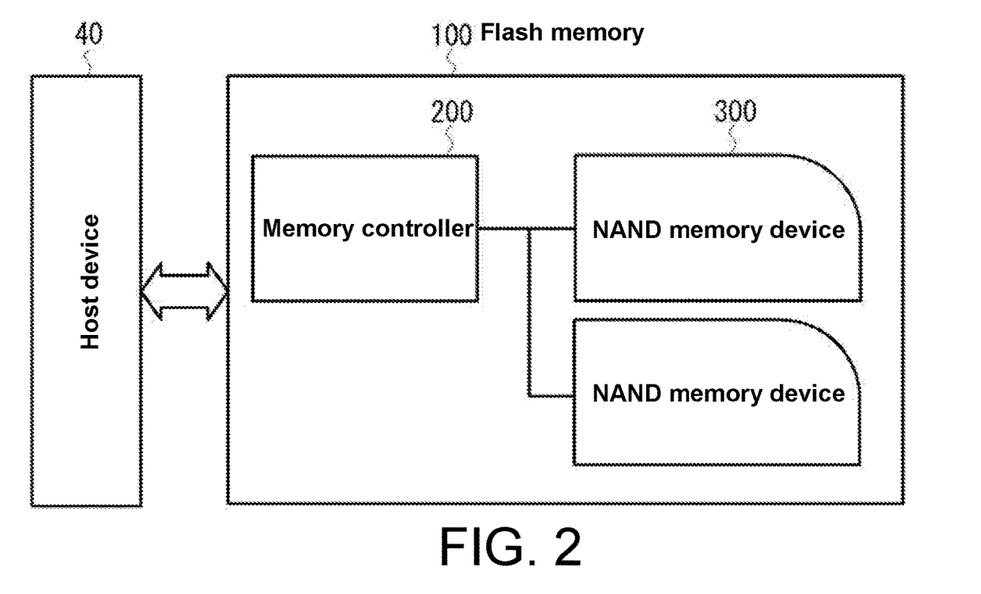
FIG. 2 is a diagram illustrating an overall configuration of a flash memory according to an embodiment of the disclosure.

FIG. 2 is a diagram illustrating an overall configuration of a flash memory 100 according to an embodiment of the disclosure. The flash memory 100 in this embodiment includes a memory controller 200 and at least one NAND memory device 300. The memory controller 200 receives various control signals (a command latch enabling signal CLE, an address latch enabling signal ALE, and so on), data, commands, and so forth from a host device 40 and controls a reading operation, a programming (writing) operation, and an erasing operation of the NAND memory device 300 according to the signals and the like. In addition, the memory controller 200 outputs a ready signal or a busy signal indicating an operation state of the memory device 300 to the host device 40.

Figure 3:
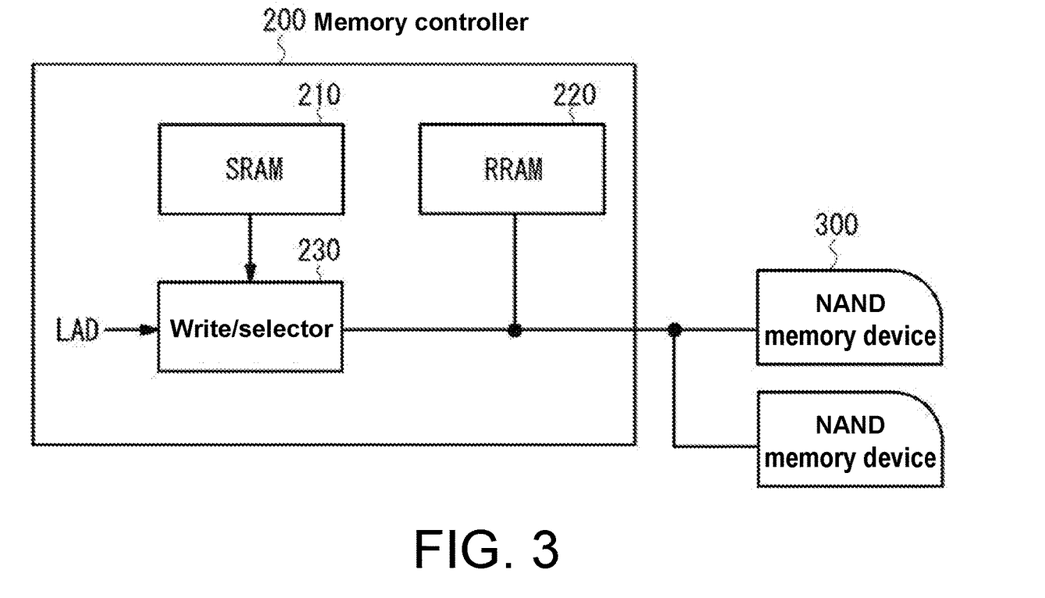
FIG. 3 is a block diagram illustrating an internal structure of a memory controller according to an embodiment of the disclosure.

FIG. 3 is a block diagram illustrating an internal structure of a memory controller 200 according to an embodiment of the disclosure. The memory controller 200 in this embodiment includes an SRAM 210, an RRAM 220, and a write/selector 230. Moreover, the memory controller 200 includes a microprocessor (MPU) or an ROM in addition to the above. Through executing software programs stored in the ROM, the memory controller 200 controls various operations of the NAND memory device 300 or controls the write/selector 230.

The SRAM 210 may store various data required for the operation of the NAND memory device 300. For instance, a conversion table that records the relationship between a logical address and a physical address, a table indicating the state of each page of a block of the memory device (e.g., writing data, erasing data, invalid data, etc.), and the like are stored. When power is turned on and a power-on sequence is performed, the data are loaded from a prepared area in a memory unit array of the NAND memory device 300.

The RRAM 220 is a variable resistive random access memory that stores data in a reversible and non-volatile variable resistive element. The RRAM 220 is capable of reading and writing data as quickly as the SRAM 210 and is able to retain the data even if the power is off.

The RRAM 220 provides temporary or alternative memory space for an NAND memory unit array of the NAND memory device 300. In particular, the RRAM 220 stores the data which should be programmed (the to-be-programmed data) and the address information of the data (including the logical address and the physical address obtained by converting the physical address) if the amount of the to-be-programmed data in the NAND memory device 300 is less than a predetermined baseline amount U of data.

The baseline amount U of data may be arbitrarily determined. For instance, when the amount of data of one page is set as P, the baseline amount U of data may be set as U=P−M. By setting the value of M to be zero or very small, the unused data area may be minimized in one programming operation. In addition, when a partial page programming function is loaded into the flash memory 100, the baseline amount U of data may also be set corresponding to the maximum number of times of programming operations NOP allowed in the same page. If it is assumed that the NOP is five, and if the amount of data during one programming operation is less than P/5, there may be a possibility of forming a redundant area in the page when the allowed NOP has been reached (assuming that the to-be-programmed data are equal). Therefore, the baseline amount U of data may also be set as U≥P/5.

If the amount of the to-be-programmed data is less than the baseline amount U of data, the RRAM 220 accumulates the to-be-programmed data in sequence. Next, when the accumulated amount of data becomes approximately equal to the predetermined baseline amount of data, e.g., when the amount of the to-be-programmed data is approximately equal to the amount of data in one page or has exceeded the predetermined baseline amount of data, the data accumulated in the RRAM 220 are rewritten in a selected page of the NAND memory unit array of the NAND memory device 300.

When the write/selector 230 receives an instruction to perform the programming operation from the host device 40, the write/selector 230 selects the RRAM 220 or the NAND memory device 300 and controls the writing or programming operation to be performed in the selected RRAM 220 or the selected NAND memory device 300. In addition, when the write/selector 230 receives a logical address LAD from the host device 40, the write/selector 230 refers to the conversion table stored in the SRAM 210 and converts the logical address LAD into a physical address PAD. The converted physical address PAD is configured to access the NAND memory device 300.

The write/selector 230 is controlled by the memory controller 200. When the amount of the to-be-programmed data is smaller than the baseline amount U of data, the to-be-programmed data and the address information thereof are written in the RRAM 220. When the amount of the to-be-programmed data are equal to or more than the baseline amount U of data, as usual, the to-be-programmed data are programmed in the selected page of the memory unit array of the NAND memory device 300.

The NAND memory device 300 includes: the memory unit array including the NAND string, a row selection circuit that selects a word line of a selected block of the memory unit array according to a row address, a column selection circuit that selects a bit line according to a column address, and a page buffer/sensing circuit that senses the read data by the selected bit line or maintains the to-be-programmed data. The row address decoded by the row selection circuit is a physical address including a physical block address PBA and a logical page address LPA. In addition, the column address decoded by the column selection circuit is a logical column address LCA.

Figure 4:
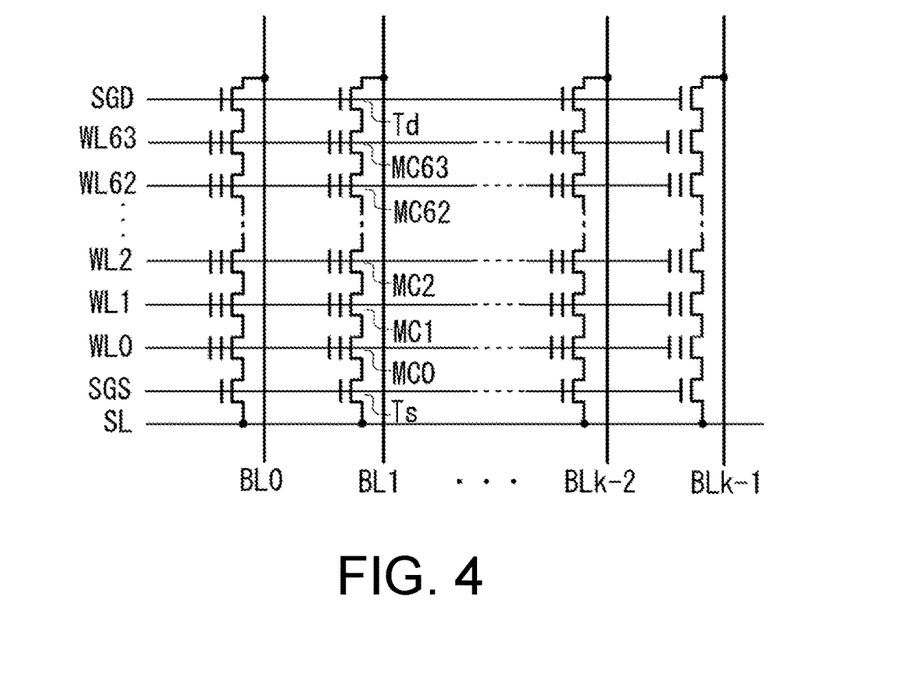
FIG. 4 is a diagram illustrating an internal structure of a block of a memory unit array according to an embodiment of the disclosure.

In one block of the memory unit array, as shown in FIG. 4, n NAND strings (for instance, 2 KB) in which a plurality of memory units are connected in series in a row direction are arranged. One NAND string NU includes: a plurality of memory units MCi (i=1, 2, 3, . . . , and 63) connected in series, a bit line side selected transistor Td connected to a drain of the memory unit MC63 acting as one end, and a source line side selected transistor Ts connected to a source line of the memory unit MC0. A drain of the bit line side selected transistor Td is connected to a corresponding bit line BL, and a source of the source line side selected transistor Ts is connected to a common source line SL. The memory unit may either store one bit of data or a plurality of bits of data. Furthermore, the memory unit array may be formed on the substrate two-dimensionally or three-dimensionally.

In the reading operation, a certain positive voltage is applied to the bit line, and a certain voltage (e.g., 0 V) is applied to the selected word line, a pass voltage (e.g., 4.5 V) is applied to the unselected word lines, and a positive voltage (e.g., 4.5 V) is applied to a selected gate line SGD and a selected gate line SGS, the bit line side selected transistor Td and the source line side selected transistor Ts are switched on, and the common source line SL set to 0 V. In the programming operation, a high programming voltage (e.g., 15 V to 20 V) applied to the selected word line, an intermediate potential (e.g., 10 V) is applied to the unselected word lines, the bit line side selected transistor Td is switched on, the source line side selected transistor Ts is switched off, and a potential corresponding to data "0" or data "1" supplied to the bit line BL. In the erasing operation, 0 V is applied to the selected word line in the block, a high voltage (e.g., 20 V) is applied to a p well, and electrons of a floating gate are extracted onto the substrate, so as to erase the data in unit of blocks.

Figure 5:
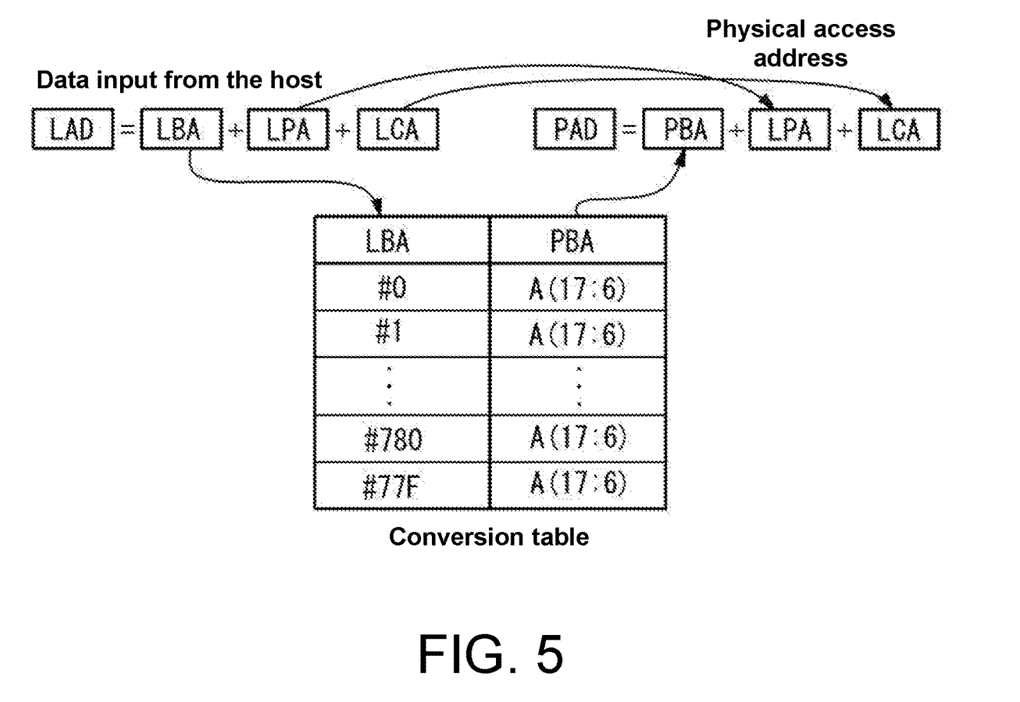
FIG. 5 is a diagram illustrating an operation of converting a logical address from a host device into a physical address based on a conversion table stored in an SRAM.

Next, the programming operation of the flash memory 100 is explained. When the host device 40 performs the programming operation in the flash memory 100, in addition to various control signals, the host device 40 outputs a programming command, the to-be-programmed data, and the logical address LAD to the flash memory 100. The logical address LAD input from the host device 40 is shown in FIG. 5 and includes the logical block address LBA, the logical page address LPA, and the logical column address LCA.

When the write/selector 230 receives the logical address LAD, it refers to the conversion table stored in the SRAM 210 and converts the logical block address LBA into the physical block address PBA. In this exemplary embodiment, the row address configured to access the NAND memory device 300 is 18 bits, and the column address is 12 bits. The upper 12 bits of the row address are the address of the specified block, and the lower 6 bits are the address of the specified page. The logical page address LPA and the logical column address LCA are not converted and directly constitute a physical address. As such, the logical address LAD is converted into the physical address PAD (=PBA+LPA+LCA) for accessing the memory device.

The write/selector 230 is controlled by the memory controller 200 and supplies the converted physical address PAD to the word line selected circuit or the row selection circuit of the NAND memory device 300. In response thereto, a block/page is selected by the word line selected circuit, a bit line is selected by the row selection circuit, and the data are programmed in the selected page of the selected memory unit. In addition, the selected memory unit is verified. When the programming operation is completed, the ready signal is output to the host device 40. If the programming operation is in progress, the busy signal is output to the host device 40.

Figure 6:
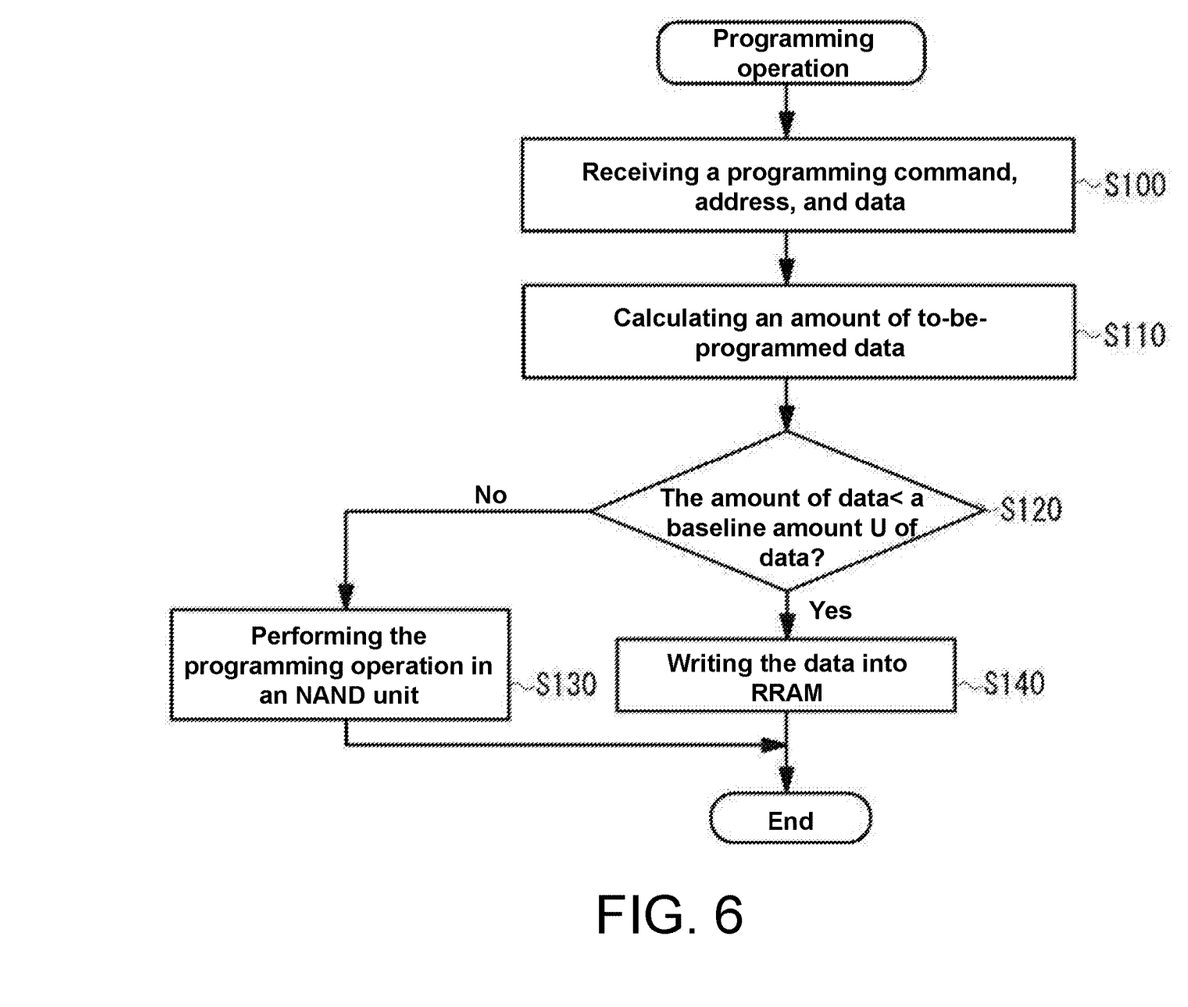
FIG. 6 is a diagram illustrating a process of a programming operation according to an embodiment of the disclosure.

Next, with reference to the process shown in FIG. 6, when the amount of data less than the baseline amount U of data is input from the host device 40, the programming operation is described. If the write/selector 230 (or the memory controller 200) receives the programming command, the logical address, and the to-be-programmed data from the host device 40 (S100), the amount of the to-be-programmed data is calculated (S110). The amount of the to-be-programmed data is calculated by counting the number of clocks of a strobe signal (e.g., /WE signal), for instance, and the strobe signal is a strobe signal when the to-be-programmed data in an external input/output terminal supplied to the flash memory 100 are moved into an internal input buffer area. Alternatively, the calculation may be done according to an address index indicating the data storage location of the input buffer area.

The write/selector 230 then determines whether the amount of the to-be-programmed data is less than the baseline amount U of data (S120). If the amount of the to-be-programmed data is equal to or more than the baseline amount U of data, the data stored in the input buffer area are placed in the page buffer/sensing circuit as before, and the programming operation is performed in a selected page of the NAND memory unit array of the NAND memory device 300 (S130). On the other hand, when the amount of the to-be-programmed data is less than the baseline amount U of data, the data stored in the input buffer area and the address information are written into the RRAM 220 together (S140).

Figure 7:
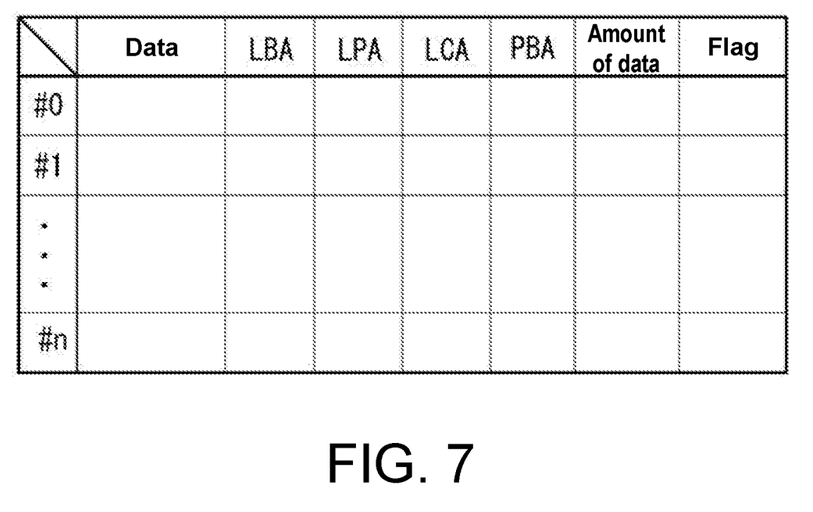
FIG. 7 is a diagram illustrating an example of accumulation of an RRAM according to an embodiment of the disclosure.

FIG. 7 exemplarily illustrates the data storage of the RRAM 220. As shown in FIG. 7, the RRAM 220 stores, for instance, the to-be-programmed data, the logical block address LBA, the logical page address LPA, the logical column address LCA, the physical block address PBA, the amount of the to-be-programmed data, and a flag indicating whether the to-be-programmed data are valid. If the to-be-programmed data whose amount is less than the baseline amount U of data are continuously or intermittently input from the host device 40, segments of the to-be-programmed data whose amount is less than the baseline amount U of data are accumulated in the RRAM 22. If the accumulated segments reach the baseline amount U of data, the to-be-programmed data are programmed in the NAND memory unit array of the NAND memory device 300.

Figure 8:
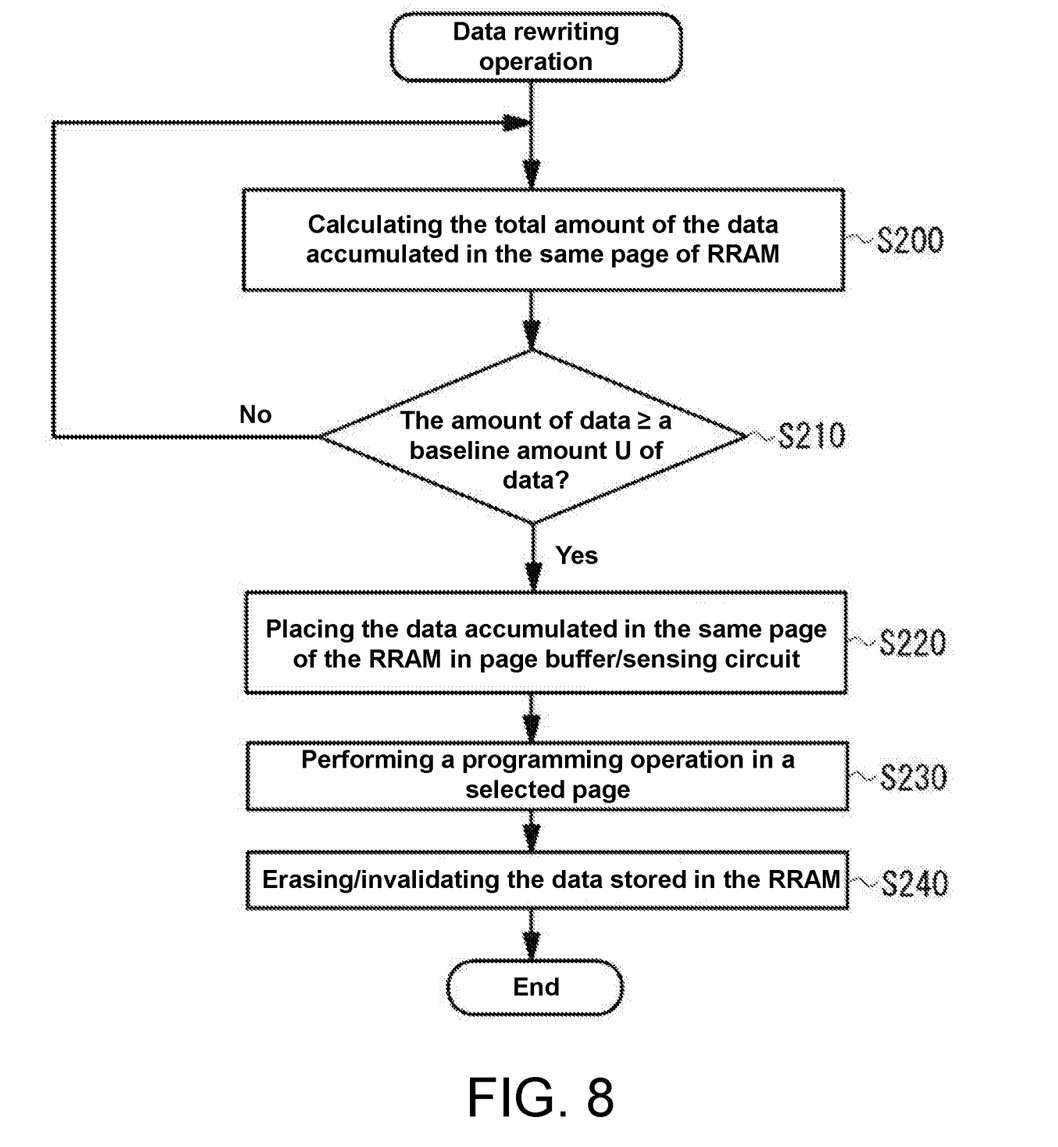
FIG. 8 is a diagram illustrating a process of a programming operation on data of the RRAM in the NAND memory unit according to an embodiment of the disclosure.

FIG. 8 is a diagram illustrating a process of rewriting the data stored in the RRAM in the NAND memory device 300 according to an embodiment of the disclosure. The write/selector 230 refers to the flag of the RRAM 220 and searches for valid segments of the data. The total amount of the segments of the data which are not rewritten in the same page is calculated (S200). The write/selector 230 determines whether the total amount of the segments of the data exceeds the baseline amount U of data (S210). As provided above, where the baseline amount U of data is determined corresponding to the amount P of data of one page/the allowed NOP, the baseline amount U of data may be set as the amount of data of one page or a similar value. Furthermore, where the programming operation is continuously performed in a plurality of pages, the baseline amount U of data may be set as the amount of data of a plurality of pages or a similar value.

When the total amount of data of the segments of the data exceeds the baseline amount U of data, the segments of the data are placed in the page buffer/sensing circuit according to the logical column address LCA (S220). A programming voltage is then applied to the selected word line according to the physical block address PBA and the logical page address LPA, and the segments of the data are collectively programmed in the selected page of the NAND memory unit array (S230). In order to invalidate the data stored in the RRAM 220, the write/selector 230 resets the flag or erases the data stored in the RRAM 220 (S240). After the flag is reset, the data are then erased.

Moreover, the data stored in the RRAM 220 in the NAND memory unit array of the NAND memory device 300 may be rewritten in the background of the flash memory 100 or may be rewritten in association with actions of rules.

Figure 9:
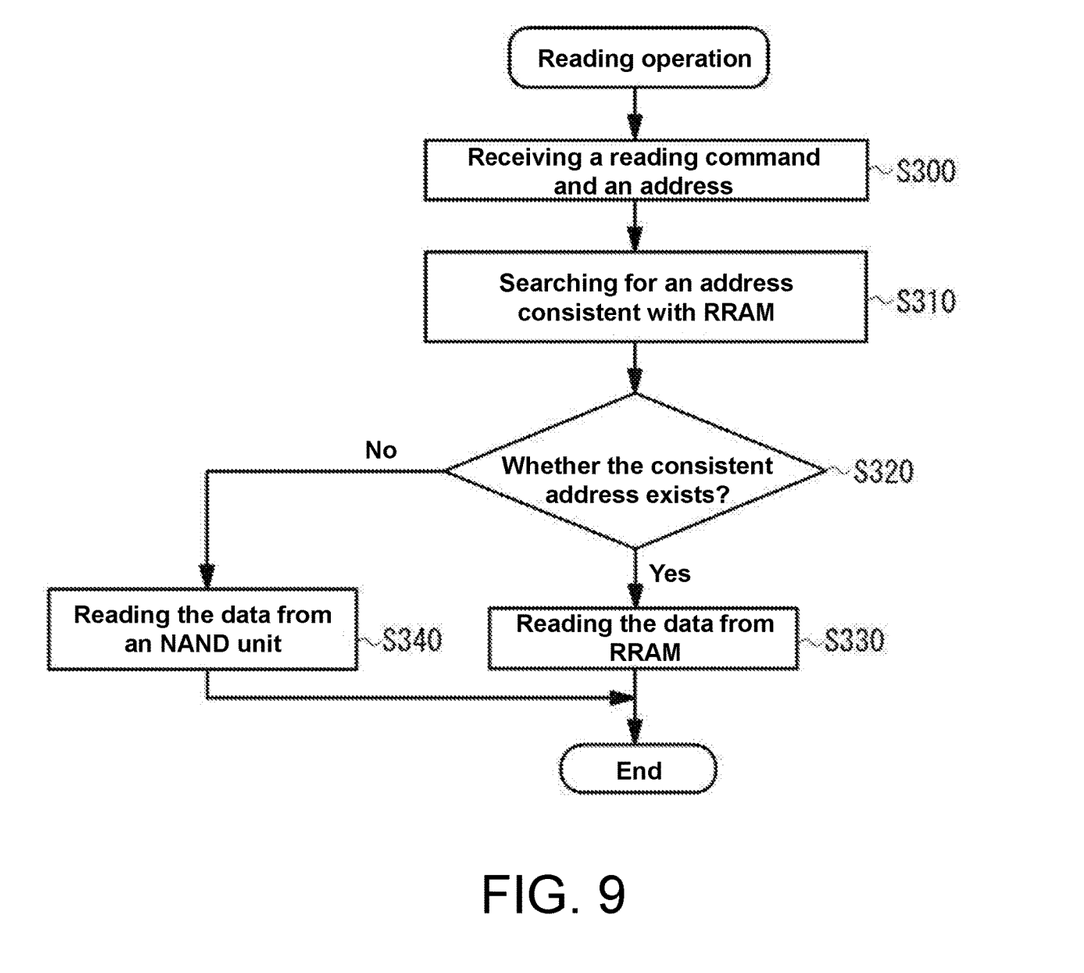
FIG. 9 is a diagram illustrating a process of a reading operation according to the embodiment of the disclosure.

Next, the reading operation provided in an embodiment of the disclosure is explained with reference to the process shown in FIG. 9. If the memory controller 200 receives a reading command and a logical address (S300) from the host device 40, the memory controller 200 refers to the flag of the RRAM 220 and searches for the data which are not rewritten and are consistent with the input logical addresses (LBA+LPA+LCA) (S310). Alternatively, it is also likely to search for the data which are not rewritten and are consistent with the physical address (PBA+LPA+LCA) converted from the input logical addresses.

If the consistent data which are not rewritten exist (S320), the memory controller 200 reads the matched data from the RRAM 220 through the write/selector 230 (S330) and outputs the read data to the host device 40. On the other hand, if no consistent data which are not rewritten exist, the memory controller 200 reads the matched data from the NAND memory device 300 through the write/selector 230 (S340) and outputs the read data to the host device 40.

As such, according to the embodiment, by writing the data with the data amount less than the baseline amount U of data into the RRAM 220, the maximum NOP allowed in the same page of the flash memory 100 is not construed as a limitation, and it is likely to program the data with the small data amount in the flash memory 100. In addition, when the amount of data stored in the RRAM 220 has reached the baseline amount U of data, the rewriting operation is performed in the NAND memory unit array, so as to reduce the number of times of programming operations in the NAND memory unit array, thereby enhancing the endurance or data retention capabilities of the NAND memory unit array.

According to one or more embodiments of the disclosure, favorable effects are achieved if the segments of data are continuously programmed on the same page. In an embodiment, the host device 40 may perform the programming operation in unit of bytes or words in the same page of the flash memory. If the amount of data in one page is, for instance, 2 KB, the host device 40 may repeat the writing operation of the byte unit of data 2,000 times, regardless of the allowed number of times of programming operations NOP in the same page.

Furthermore, in the embodiment, the RRAM serves as the non-volatile memory; however, as long as the data writing operation is faster than the NAND memory, in addition to the RRAM, a magnetic random access memory (MRAM) may also be used.

Although the disclosure has been disclosed in the above embodiments, it is not intended to limit the disclosure, and any one of ordinary skill in the art will be able to make some modifications and refinements without departing from the spirit and scope of the disclosure. The scope of the disclosure is defined by the scope of the appended claims.

What is claimed is:

1. A semiconductor storage apparatus, comprising:
    an NAND memory unit may, comprising a plurality of blocks;
    a non-volatile memory capable of reading and writing data;
    a programming element, wherein when a programming command, address information, and to-be-programmed data are input from the outside, if an amount of the to-be-programmed data is less than a baseline amount of data, the to-be-programmed data and the address information are written into the non-volatile memory, and if the amount of the to-be-programmed data is equal to or more than the baseline amount of data, the to-be-programmed data are programmed in the NAND memory unit array; and a reading element, when the reading element inputs a reading command and the address information from the outside, if the address information in the non-volatile memory is consistent with the address information input from the outside, the data are read from the non-volatile memory, and if the address information in the non-volatile memory is inconsistent with the address information input from the outside, the data are read from the NAND memory unit array.

2. The semiconductor storage apparatus according to claim 1, wherein when the amount of the to-be-programmed data accumulated in a same page of the non-volatile memory is equal to or more than the baseline amount of data, the programming element programs the accumulated to-be-programmed data in a selected page of the NAND memory unit array.

3. The semiconductor storage apparatus according to claim 1, further comprising a memory storing a conversion table that converts a logical address into a physical address, the programming element refers to the conversion table to convert the logical address input from the outside into the physical address, and the logical address and the physical address are written into the non-volatile memory as the address information.

4. The semiconductor storage apparatus according to claim 2, wherein after the programming element in the NAND memory unit array programs the to-be-programmed data accumulated in the non-volatile memory, and corresponding data of the non-volatile memory become invalid.

5. The semiconductor storage apparatus according to claim 1, wherein the programming element is capable of programming on a byte unit or a word unit in the NAND memory unit array.

6. The semiconductor storage apparatus according to claim 1, wherein the non-volatile memory is a resistive random access memory.

7. The semiconductor storage apparatus according to claim 1, wherein the non-volatile memory stores the to-be-programmed data, logical block address, a logical page address, a logical column address, a physical block address, the amount of the to-be-programmed data, and a flag indicating whether the to-be-programmed data are valid.

8. The semiconductor storage apparatus according to claim 1, wherein the baseline amount of data is set as an amount of data of one page.

9. The semiconductor storage apparatus according to claim 1, wherein the baseline amount of data is set as an amount of data of a plurality of pages.

10. A semiconductor storage apparatus, comprising:
a memory unit array, comprising a plurality of blocks;
a non-volatile memory capable of reading and writing data;
a programming element, wherein when a programming command, address information, and to-be-programmed data are input from the outside, if an amount of the to-be-programmed data is less than a baseline amount of data, the to-be-programmed data and the address information are written into the non-volatile memory, and if the amount of the to-be-programmed data is equal to or more than the baseline amount of data, the to-be-programmed data are programmed in the memory unit array; and wherein in response to determining that the amount of the to-be-programmed data accumulated in a same page of the non-volatile memory is equal to or more than the baseline amount of data, the programming element programs the accumulated to-be-programmed data to a selected page of the memory unit array.

11. The semiconductor storage apparatus according to claim 10, wherein the semiconductor storage apparatus further comprises a reading element, when the reading element inputs a reading command and the address information from the outside, if the address information in the non-volatile memory is consistent with the address information input from the outside, the data are read from the non-volatile memory, and if the address information in the non-volatile memory is inconsistent with the address information input from the outside, the data are read from the memory unit array.

12. The semiconductor storage apparatus according to claim 10, further comprising a memory storing a conversion table that converts a logical address into a physical address, the programming element refers to the conversion table to convert the logical address input from the outside into the physical address, and the logical address and the physical address are written into the non-volatile memory as the address information.

13. The semiconductor storage apparatus according to claim 10, wherein after the programming element in the memory unit array programs the to-be-programmed data accumulated in the non-volatile memory, and corresponding data of the non-volatile memory become invalid.

14. The semiconductor storage apparatus according to claim 10, wherein the non-volatile memory stores the to-be-programmed data, logical block address, a logical page address, a logical column address, a physical block address, the amount of the to-be-programmed data, and a flag indicating whether the to-be-programmed data are valid.

15. A semiconductor storage apparatus, comprising:
a memory unit array, comprising a plurality of blocks;
a non-volatile memory capable of reading and writing data; and
a programming element, wherein when a programming command, address information, and to-be-programmed data are input from the outside, if an amount of the to-be-programmed data is less than a baseline amount of data, the to-be-programmed data and the address information are written into the non-volatile memory, and if the amount of the to-be-programmed data is equal to or more than the baseline amount of data, the to-be-programmed data are programmed in the memory unit array,
wherein after the programming element in the memory unit array programs the to-be-programmed data accumulated in the non-volatile memory, and corresponding data of the non-volatile memory become invalid.

16. The semiconductor storage apparatus according to claim 15, wherein when the amount of the to-be-programmed data accumulated in a same page of the non-volatile memory is equal to or more than the baseline amount of data, the programming element programs the accumulated to-be-programmed data in a selected page of the memory unit array.

17. The semiconductor storage apparatus according to claim 15, wherein the semiconductor storage apparatus further comprises a reading element, when the reading element inputs a reading command and the address information from the outside, if the address information in the non-volatile memory is consistent with the address information input from the outside, the data are read from the non-volatile memory, and if the address information in the non-volatile memory is inconsistent with the address information input from the outside, the data are read from the memory unit array.

18. The semiconductor storage apparatus according to claim 15, further comprising a memory storing a conversion table that converts a logical address into a physical address,
the programming element refers to the conversion table to convert the logical address input from the outside into the physical address, and the logical address and the physical address are written into the non-volatile memory as the address information.

19. The semiconductor storage apparatus according to claim 15, wherein the non-volatile memory stores the to-be-programmed data, logical block address, a logical page address, a logical column address, a physical block address, the amount of the to-be-programmed data, and a flag indicating whether the to-be-programmed data are valid.

\* \* \* \* \*